United States Patent
Wu et al.

(10) Patent No.: US 11,557,651 B2
(45) Date of Patent: Jan. 17, 2023

(54) NANOSHEET TRANSISTORS WITH INNER AIRGAPS

(71) Applicant: INTERNATIONAL BUSINESS MACHINES CORPORATION, Armonk, NY (US)

(72) Inventors: Heng Wu, Guilderland, NY (US); Ruilong Xie, Niskayuna, NY (US); Alexander Reznicek, Troy, NY (US); Lan Yu, Voorheesville, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 170 days.

(21) Appl. No.: 17/132,798

(22) Filed: Dec. 23, 2020

(65) Prior Publication Data

US 2021/0151556 A1    May 20, 2021

Related U.S. Application Data

(62) Division of application No. 16/515,526, filed on Jul. 18, 2019, now Pat. No. 10,910,470.

(51) Int. Cl.
*H01L 29/06* (2006.01)
*H01L 29/786* (2006.01)
*H01L 29/66* (2006.01)

(52) U.S. Cl.
CPC ........ *H01L 29/068* (2013.01); *H01L 29/0653* (2013.01); *H01L 29/66545* (2013.01); *H01L 29/78696* (2013.01)

(58) Field of Classification Search
CPC .............. H01L 29/068; H01L 29/0653; H01L 29/66545; H01L 29/78696; H01L 29/0673; H01L 29/42392; H01L 29/4991; H01L 29/66439; H01L 29/6653; H01L 29/775; H01L 29/7848; B82Y 10/00
See application file for complete search history.

(56) References Cited

U.S. PATENT DOCUMENTS

| 9,362,355 | B1 * | 6/2016 | Cheng | ................ H01L 29/4991 |
| 9,721,897 | B1 * | 8/2017 | Cheng | ............... H01L 21/28247 |
| 9,799,748 | B1 | 10/2017 | Xie et al. | |

(Continued)

OTHER PUBLICATIONS

List of IBM Patents or Patent Applications Treated as Related dated Dec. 23, 2020, 2 pages.

*Primary Examiner* — Victor A Mandala
(74) *Attorney, Agent, or Firm* — Tutunjian & Bitetto, P.C.; Robert Sullivan (57) ABSTRACT

A method is presented for constructing a nanosheet transistor. The method includes forming a nanosheet stack including alternating layers of a first material and a second material over a substrate, forming a dummy gate over the nanosheet stack, forming sacrificial spacers adjacent the dummy gate, and selectively etching the alternating layers of the first material to define gaps between the alternating layers of the second material. The method further includes filling the gaps with inner spacers, epitaxially growing source/drain regions adjacent the nanosheet stack, selectively removing the sacrificial spacers and the inner spacers to define cavities, and filling the cavities with a spacer material to define first airgaps adjacent the dummy gate and second airgaps adjacent the etched alternating layers of the first material.

20 Claims, 8 Drawing Sheets

(56) References Cited

U.S. PATENT DOCUMENTS

| | | | |
|---|---|---|---|
| 9,905,643 B1 | | 2/2018 | Bergendahl et al. |
| 9,941,118 B2 | | 4/2018 | Leobandung |
| 9,954,058 B1 | * | 4/2018 | Mochizuki ........ H01L 29/42392 |
| 10,243,043 B2 | * | 3/2019 | Mochizuki ........ H01L 29/42392 |
| 10,700,064 B1 | * | 6/2020 | Zhang .................... H01L 29/78 |
| 10,714,569 B1 | * | 7/2020 | Kong .................... H01L 29/785 |
| 10,714,570 B2 | * | 7/2020 | Cheng .............. H01L 29/42356 |
| 11,152,510 B2 | * | 10/2021 | Zhang .............. H01L 29/66545 |
| 2017/0141207 A1 | * | 5/2017 | Cheng ................. H01L 23/5329 |
| 2017/0309719 A1 | | 10/2017 | Sun et al. |
| 2018/0090586 A1 | | 3/2018 | Cheng et al. |
| 2018/0277656 A1 | | 9/2018 | Chao et al. |
| 2018/0301564 A1 | | 10/2018 | Kwon et al. |
| 2018/0331232 A1 | * | 11/2018 | Frougier ........... H01L 29/78618 |
| 2018/0358435 A1 | * | 12/2018 | Mochizuki .......... H01L 29/0673 |
| 2019/0027570 A1 | | 1/2019 | Ching et al. |
| 2019/0157414 A1 | * | 5/2019 | Ando ............. H01L 21/823864 |
| 2019/0305104 A1 | * | 10/2019 | Xie ..................... H01L 29/4908 |
| 2020/0020690 A1 | * | 1/2020 | Ando ............... H01L 29/42392 |
| 2020/0027791 A1 | * | 1/2020 | Loubet ................. H01L 29/165 |
| 2020/0075720 A1 | * | 3/2020 | Cheng .............. H01L 29/78696 |
| 2020/0083352 A1 | * | 3/2020 | Chanemougame ........................ H01L 29/6681 |
| 2020/0098879 A1 | * | 3/2020 | Lee .................. H01L 29/66439 |
| 2020/0126798 A1 | * | 4/2020 | Lin .................. H01L 21/28518 |
| 2021/0074548 A1 | * | 3/2021 | Lin ........................ B82Y 10/00 |
| 2021/0305390 A1 | * | 9/2021 | Lee .................. H01L 29/66553 |
| 2022/0157666 A1 | * | 5/2022 | Bi ......................... H01L 27/092 |
| 2022/0238707 A1 | * | 7/2022 | Yang .................. H01L 21/3086 |

\* cited by examiner

NANOSHEET TRANSISTORS WITH INNER AIRGAPS

BACKGROUND

The present invention relates generally to semiconductor devices, and more specifically, to nanosheet transistors with inner airgaps.

As semiconductor integrated circuits (ICs) or chips become smaller, stacked nanosheets, which are two-dimensional nanostructures with a thickness range on the order of 1 to 100 nanometers, are increasingly used. Nanosheets and nanowires are seen as a feasible device option for 7 nanometer and beyond scaling of semiconductor devices. The general process flow for nanosheet formation involves removing sacrificial layers of silicon germanium (SiGe) between the silicon (Si) sheets.

SUMMARY

In accordance with an embodiment, a method is provided for constructing a nanosheet transistor. The method includes forming a nanosheet stack including alternating layers of a first material and a second material over a substrate, forming a dummy gate over the nanosheet stack, forming sacrificial spacers adjacent the dummy gate, selectively etching the alternating layers of the first material to define gaps between the alternating layers of the second material, filling the gaps with inner spacers, epitaxially growing source/drain regions adjacent the nanosheet stack, selectively removing the sacrificial spacers and the inner spacers to define cavities, and filling the cavities with a spacer material to define first airgaps adjacent the dummy gate and second airgaps adjacent the etched alternating layers of the first material.

In accordance with another embodiment, a method is provided for constructing a nanosheet transistor. The method includes forming a nanosheet stack including alternating layers of a first material and a second material over a substrate, forming a dummy gate over the nanosheet stack, selectively etching the alternating layers of the first material to define gaps between the alternating layers of the second material, filling the gaps with inner spacers, epitaxially growing source/drain regions adjacent the nanosheet stack, selectively removing the inner spacers to define first cavities, and filling the first cavities with a spacer material to define first airgaps adjacent the etched alternating layers of the first material.

In accordance with yet another embodiment, a nanosheet transistor is provided. The nanosheet transistor includes a nanosheet stack including alternating layers of a recessed first material and a second material, source/drain regions disposed adjacent the nanosheet stack, a conductive material disposed over the source/drain regions, first airgaps defined between the source/drain regions and the recessed alternating layers of the first material, and second airgaps defined adjacent the conductive material, wherein the first airgaps are vertically aligned with the second airgaps.

It should be noted that the exemplary embodiments are described with reference to different subject-matters. In particular, some embodiments are described with reference to method type claims whereas other embodiments have been described with reference to apparatus type claims. However, a person skilled in the art will gather from the above and the following description that, unless otherwise notified, in addition to any combination of features belonging to one type of subject-matter, also any combination between features relating to different subject-matters, in particular, between features of the method type claims, and features of the apparatus type claims, is considered as to be described within this document.

These and other features and advantages will become apparent from the following detailed description of illustrative embodiments thereof, which is to be read in connection with the accompanying drawings.

BRIEF DESCRIPTION OF THE DRAWINGS

The invention will provide details in the following description of preferred embodiments with reference to the following figures wherein.

Throughout the drawings, same or similar reference numerals represent the same or similar elements.

DETAILED DESCRIPTION

Embodiments in accordance with the present invention provide methods and devices for enabling a later inner spacer process in nanosheets with improved epi growth and strain introduction. Nanosheets provide for viable device architectures for scaling complementary metal oxide semiconductors (CMOS) beyond the 7 nm node. Thin gate dielectric nanosheet transistors can be used, e.g., for logic and static random access memory (SRAM) applications, whereas thick gate dielectric nanosheet transistors can be used, e.g., for high voltage and analog applications.

Embodiments in accordance with the present invention provide methods and devices for forming a nanosheet structure with source/drain regions before the device spacer formation to enable improved epi quality and strain introduction. With the sacrificial spacer modification, airgap spacers are realized for both the gate spacers and the inner spacers in the nanosheet structure.

Embodiments in accordance with the present invention provide methods and devices for constructing nanosheet devices having channel strain with high quality embedded source/drain epitaxy grown at the end of the entire nanosheet stack, instead of the Si tip, employing a sacrificial spacer process with inner spacer/gate spacer formed after epi growth, enabling growth of a sacrificial high content germanium (Ge) silicon germanium (SiGe) layer after indentation to serve as a placeholder for the inner spacers, and forming airgaps in regions where the sacrificial spacers are removed. The airgaps can be thus constructed in both the gate spacer region and the inner spacer region of the nanosheet transistor.

Examples of semiconductor materials that can be used in forming such nanosheet structures include silicon (Si), germanium (Ge), silicon germanium alloys (SiGe), silicon carbide (SiC), silicon germanium carbide (SiGeC), III-V compound semiconductors and/or II-VI compound semiconductors. III-V compound semiconductors are materials that include at least one element from Group III of the Periodic Table of Elements and at least one element from Group V of the Periodic Table of Elements. II-VI compound semiconductors are materials that include at least one element from Group II of the Periodic Table of Elements and at least one element from Group VI of the Periodic Table of Elements.

It is to be understood that the present invention will be described in terms of a given illustrative architecture; however, other architectures, structures, substrate materials and process features and steps/blocks can be varied within the scope of the present invention. It should be noted that certain features cannot be shown in all figures for the sake of clarity. This is not intended to be interpreted as a limitation of any particular embodiment, or illustration, or scope of the claims.

Figure 1:
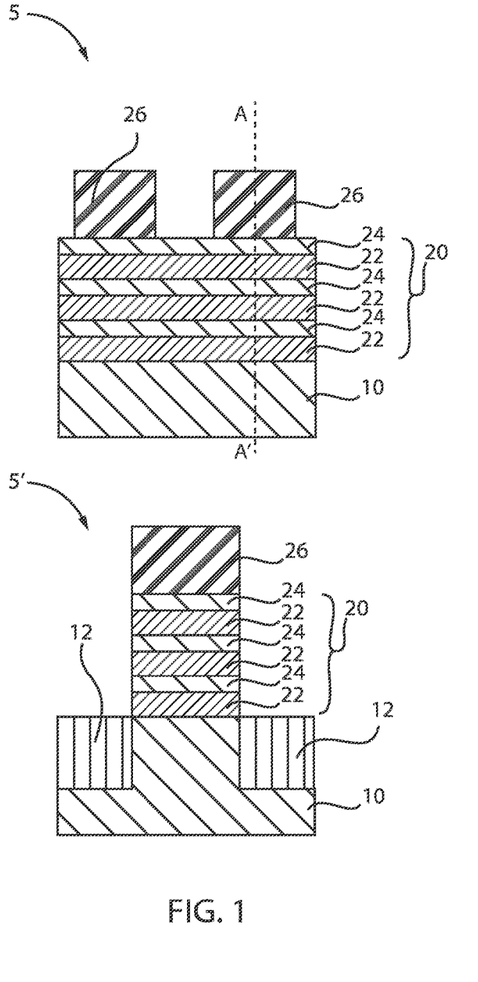
FIG. 1 is a cross-sectional view of a semiconductor structure including a nanosheet stack formed over a substrate, in accordance with an embodiment of the present invention.

FIG. 1 is a cross-sectional view of a semiconductor structure including a nanosheet stack formed over a substrate, in accordance with an embodiment of the present invention.

In various example embodiments, a semiconductor structure 5 includes shallow trench isolation (STI) regions 12 formed within a substrate 10. Multiple field effect transistor (FET) devices can be formed over the substrate 10. In one example, a single FET device can be formed over the substrate 10. The FET device can be formed by constructing a nanosheet stack.

The nanosheet stack 20 of structure 5 can include alternating layers of a first semiconductor layer 22 and a second semiconductor layer 24. The first semiconductor layer 22 can be, e.g., silicon germanium (SiGe) and the second semiconductor layer 24 can be, e.g., silicon (Si). Structure 5' is a cross-sectional view along line A-A'. Structure 5' illustrates the STI 12 formed over the substrate 10. A dummy gate 26 can also be formed over the nanosheet stack 20.

In one or more embodiments, the substrate 10 can be a semiconductor or an insulator with an active surface semiconductor layer. The substrate 10 can be crystalline, semi-crystalline, microcrystalline, or amorphous. The substrate 10 can be essentially (e.g., except for contaminants) a single element (e.g., silicon), primarily (e.g., with doping) of a single element, for example, silicon (Si) or germanium (Ge), or the substrate 10 can include a compound, for example, $Al_2O_3$, $SiO_2$, GaAs, SiC, or SiGe. The substrate 10 can also have multiple material layers, for example, a semiconductor-on-insulator substrate (SeOI), a silicon-on-insulator substrate (SOI), germanium-on-insulator substrate (GeOI), or silicon-germanium-on-insulator substrate (SGOI). The substrate 10 can also have other layers forming the substrate 10, including high-k oxides and/or nitrides. In one or more embodiments, the substrate 10 can be a silicon wafer. In an embodiment, the substrate 10 is a single crystal silicon wafer.

The shallow trench isolation (STI) regions 12 can be formed by etching a trench in doped bottom source/drain (S/D) regions (not shown) utilizing a conventional dry etching process such as reactive ion etching (RIE) or plasma etching. The trenches can optionally be lined with a conventional liner material, e.g., silicon nitride or silicon oxynitride, and then chemical vapor deposition (CVD) or another like deposition process is used to fill the trench with silicon oxide or another like STI dielectric material. The STI dielectric can optionally be densified after deposition. A conventional planarization process such as chemical-mechanical polishing (CMP) can optionally be used to provide a planar structure.

Referring to, e.g., the nanosheet stack 20, the first semiconductor layer 22 can be the first layer in a stack of sheets of alternating materials. The first nanosheet stack 20 includes first semiconductor layers 22 and second semiconductor layers 24. Although it is specifically contemplated that the first semiconductor layers 22 can be formed from silicon germanium and that the second semiconductor layers 24 can be formed from silicon, it should be understood that any appropriate materials can be used instead, as long as the two semiconductor materials have etch selectivity with respect to one another. As used herein, the term "selective" in reference to a material removal process denotes that the rate of material removal for a first material is greater than the rate of removal for at least another material of the structure to which the material removal process is being applied. The alternating semiconductor layers 22/24 can be deposited by any appropriate mechanism. It is specifically contemplated that the semiconductor layers 22/24 can be epitaxially grown from one another, but alternate deposition processes, such as chemical vapor deposition (CVD), physical vapor deposition (PVD), atomic layer deposition (ALD), or gas cluster ion beam (GCIB) deposition, are also contemplated.

Figure 2:
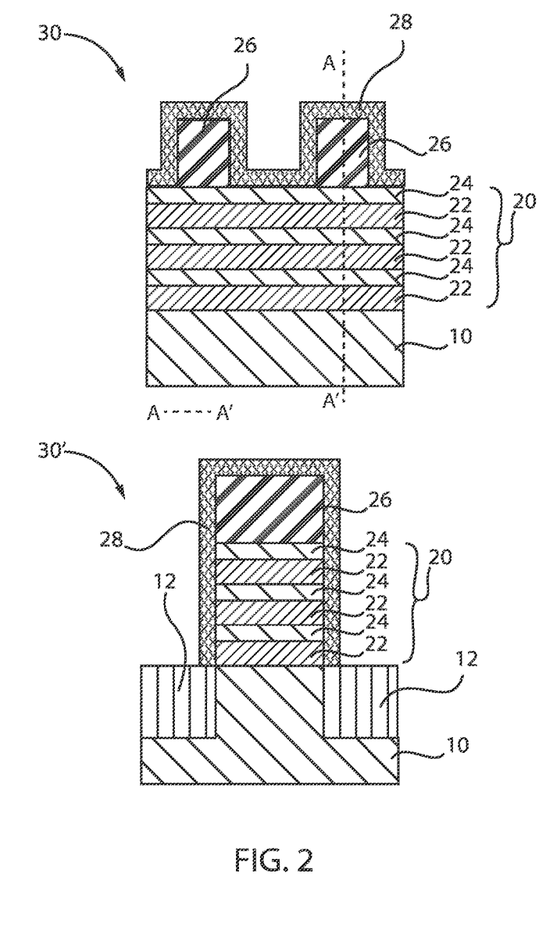
FIG. 2 is a cross-sectional view of the semiconductor structure of FIG. 1 where a dummy spacer is formed over the nanosheet stack, in accordance with an embodiment of the present invention.

FIG. 2 is a cross-sectional view of the semiconductor structure of FIG. 1 where a dummy spacer is formed over the nanosheet stack, in accordance with an embodiment of the present invention.

In various example embodiments, in structures 30, 30', a dummy spacer 28 is deposited.

The dummy spacer 28 can include any known spacer material. In one embodiment, the dummy spacer 28 includes a low-k dielectric material.

Figure 3:
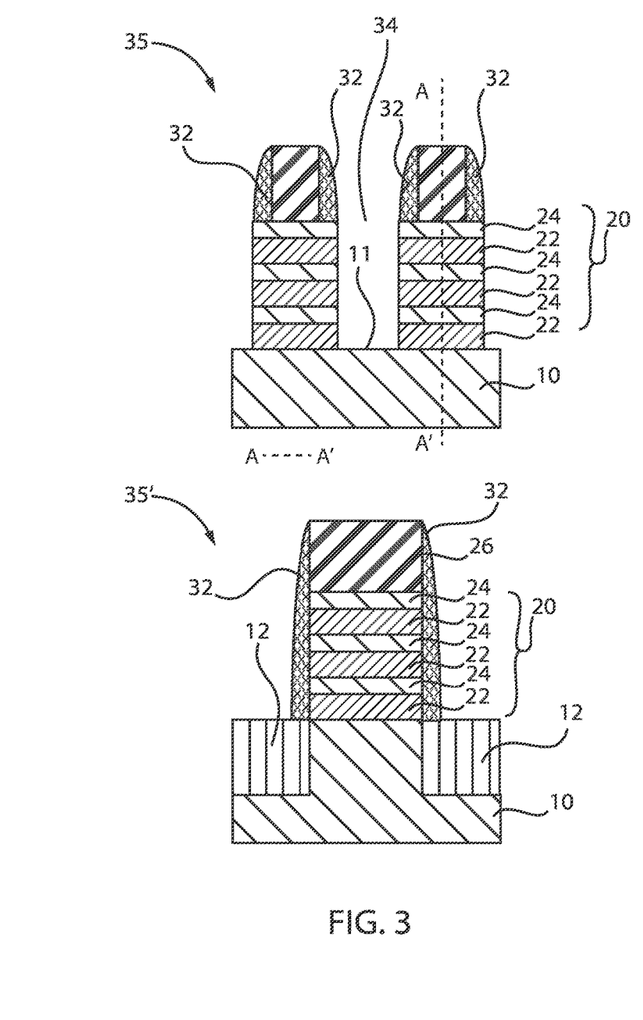
FIG. 3 is a cross-sectional view of the semiconductor structure of FIG. 2 where the dummy spacer is etched, in accordance with an embodiment of the present invention.

FIG. 3 is a cross-sectional view of the semiconductor structure of FIG. 2 where the dummy spacer is etched, in accordance with an embodiment of the present invention.

In various example embodiments, the dummy spacer 28 is etched to form spacers 32 adjacent the dummy gate 26. Any etching technique known in the art can be used. In structure 35, an opening 34 is formed between two portions of the nanosheet stack. A top surface 11 of the substrate 10 is also exposed. Structure 35' is a cross-sectional view along line A-A' and illustrates the spacers 32 adjacent the dummy gate 26 and the nanosheet stack 20.

Figure 4:
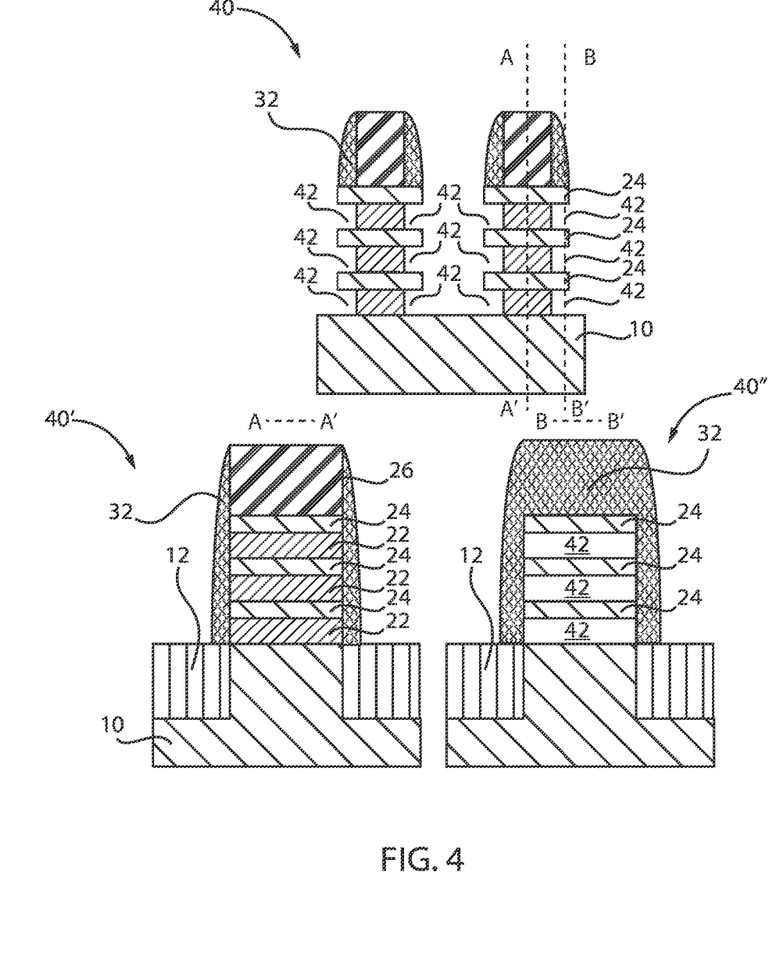
FIG. 4 is a cross-sectional view of the semiconductor structure of FIG. 3 where layers of a first material of the nanosheet structure are etched to define voids or gaps or indentations for subsequent inner spacer formation, in accordance with an embodiment of the present invention.

FIG. 4 is a cross-sectional view of the semiconductor structure of FIG. 3 where layers of a first material of the nanosheet structure are etched to define voids or gaps or indentations for subsequent inner spacer formation, in accordance with an embodiment of the present invention.

In various example embodiments, layers of a first material of the nanosheet structure are etched to create or define voids or gaps or indentations 42 for subsequent inner spacer formation.

The etching can include a dry etching process such as, for example, reactive ion etching, plasma etching, ion etching or laser ablation. The etching can further include a wet chemical etching process in which one or more chemical etchants are used to remove portions of the blanket layers that are not protected by the patterned photoresist.

In some examples, the selective wet etch or the selective dry etch can selectively remove the portions of first semiconductor layer 22 (e.g., the SiGe layer) and leave the entirety or portions of the second semiconductor layer 24. The removal creates gaps or openings or indentations 42 between the second semiconductor layers 24 of the FET device in structure 40 and gaps or openings 42 between the second semiconductor layers 24 of the FET device in structure 40", which is a cross-sectional view along line B-B'. Structure 40' is the same as structure 35' in FIG. 3.

The dry and wet etching processes can have etching parameters that can be tuned, such as etchants used, etching temperature, etching solution concentration, etching pressure, source power, RF bias voltage, RF bias power, etchant flow rate, and other suitable parameters. Dry etching processes can include a biased plasma etching process that uses a chlorine-based chemistry. Other dry etchant gasses can include Tetrafluoromethane ($CF_4$), nitrogen trifluoride ($NF_3$), sulfur hexafluoride ($SF_6$), and helium (He), and Chlorine trifluoride ($ClF_3$). Dry etching can also be performed anisotropically using such mechanisms as DRIE (deep reactive-ion etching). Chemical vapor etching can be used as a selective etching method, and the etching gas can include hydrogen chloride (HCl), Tetrafluoromethane ($CF_4$), and gas mixture with hydrogen ($H_2$). Chemical vapor etching can be performed by CVD with suitable pressure and temperature.

Figure 5:
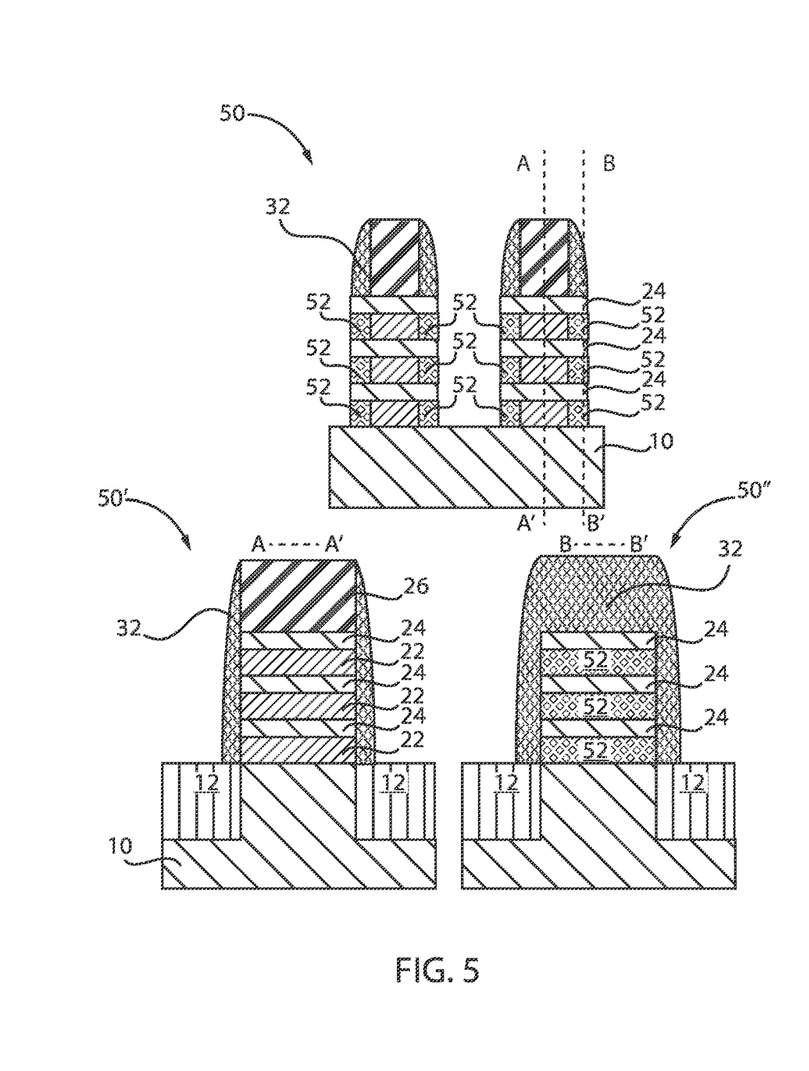
FIG. 5 is a cross-sectional view of the semiconductor structure of FIG. 4 where inner spacers are formed in the indentations of the nano sheet structure, in accordance with an embodiment of the present invention.

FIG. 5 is a cross-sectional view of the semiconductor structure of FIG. 4 where inner spacers are formed in the indentations of the nano sheet structure, in accordance with an embodiment of the present invention.

In various example embodiments, in structures 50, 50", inner spacers 52 are formed in the indentations 42 of the nanosheet structure 20. The inner spacers 52 can be e.g., SiGe with a high concentration of Ge. In one example, the Ge content can be about 70%. One skilled in the art can contemplate higher concentrations of Ge. The inner spacer material 52 seals the voids or gaps or indentations formed from the selective etching of the first semiconductor layer 22. Structure 50' remains the same as structure 40' depicted in FIG. 4.

It is further noted that the recessed SiGe layers 22 have a low concentration of Ge (less than 50%), whereas the inner spacers 52 have a high concentration of Ge (greater than 70%).

Figure 6:
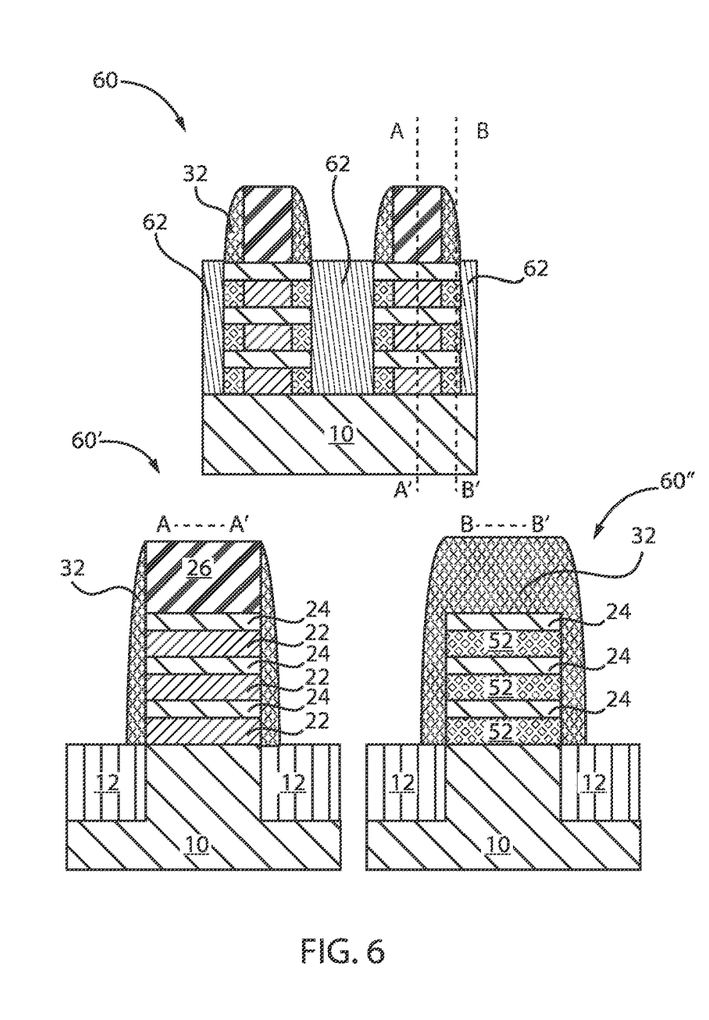
FIG. 6 is a cross-sectional view of the semiconductor structure of FIG. 5 where source/drain regions are formed, in accordance with an embodiment of the present invention.

FIG. 6 is a cross-sectional view of the semiconductor structure of FIG. 5 where source/drain regions are formed, in accordance with an embodiment of the present invention.

In various example embodiments, in structure 60, source/drain regions 62 are formed. Structures 60' and 60" remain the same as structures 50' and 50" depicted in FIG. 5.

The source/drain regions 62 can contact the inner spacers 52. The source/drain regions 62 can contact a portion of the second material 24 (e.g., Si). The source/drain regions 62 can have a height approximately equal to or greater than a height of the nanosheet stack 20.

Source/drain regions 62 are fabricated using CMOS process steps (e.g., epitaxial growth of doped semiconductor materials).

Figure 7:
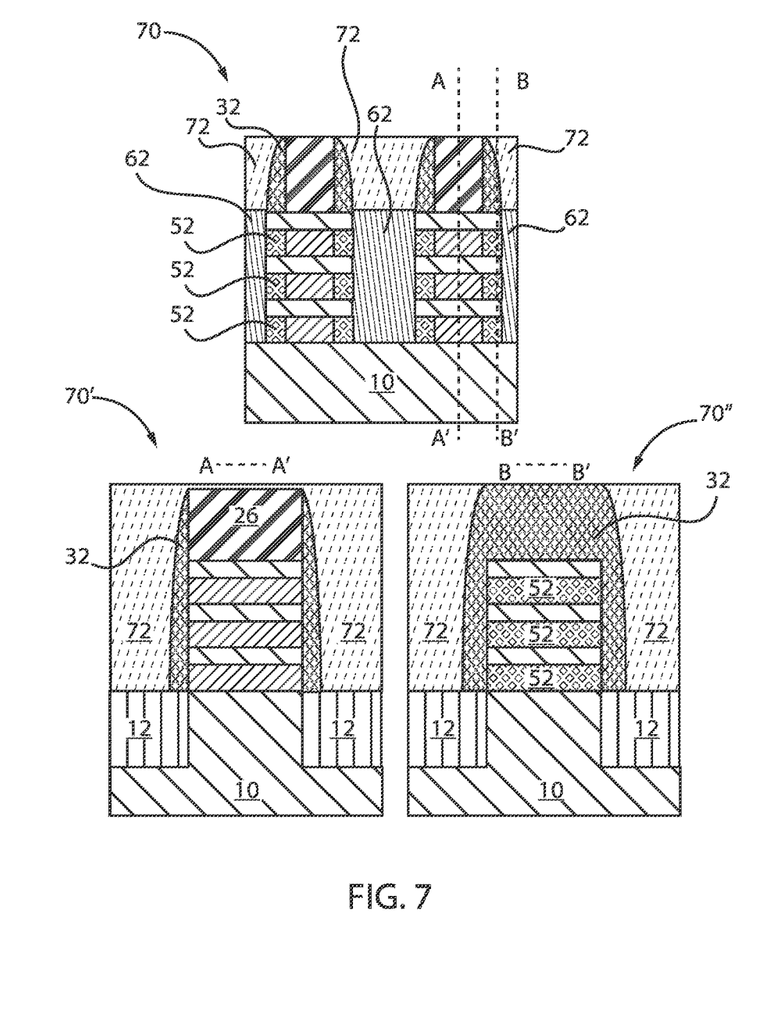
FIG. 7 is a cross-sectional view of the semiconductor structure of FIG. 6 where an inter-layer dielectric (ILD) is deposited and planarized by chemical-mechanical polishing (CMP), in accordance with an embodiment of the present invention.

FIG. 7 is a cross-sectional view of the semiconductor structure of FIG. 6 where an inter-layer dielectric (ILD) is deposited and planarized by chemical-mechanical polishing (CMP), in accordance with an embodiment of the present invention.

In various example embodiments, in structures 70, 70', 70", an inter-layer dielectric (ILD) 72 is deposited and planarized by chemical-mechanical polishing (CMP).

The ILD 72 can be any suitable material, such as, for example, porous silicates, carbon doped oxides, silicon dioxides, silicon nitrides, silicon oxynitrides, or other dielectric materials. Any known manner of forming the ILD 72 can be utilized. The ILD 72 can be formed using, for example, CVD, PECVD, ALD, flowable CVD, spin-on dielectrics, or PVD. In some embodiments, the ILD 72 is planarized to a top surface of the dummy gate 26, using, for example, a CMP operation.

Figure 8:
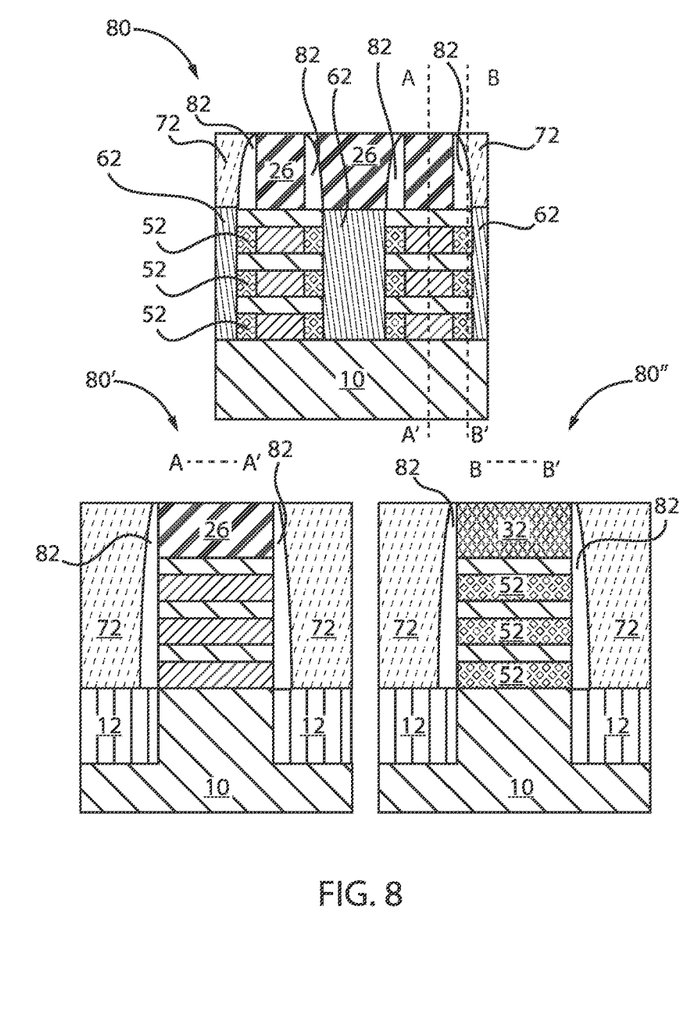
FIG. 8 is a cross-sectional view of the semiconductor structure of FIG. 7 where the dummy spacer is removed, in accordance with an embodiment of the present invention.

FIG. 8 is a cross-sectional view of the semiconductor structure of FIG. 7 where the dummy spacer is removed, in accordance with an embodiment of the present invention.

In various example embodiments, in structures 80, 80', 80", the spacers 32 are removed, thus creating openings 82 adjacent the dummy gate 26, as well as adjacent the nanosheet stack 20. The removal can be accomplished by etching, such as, e.g., RIE.

Figure 9:
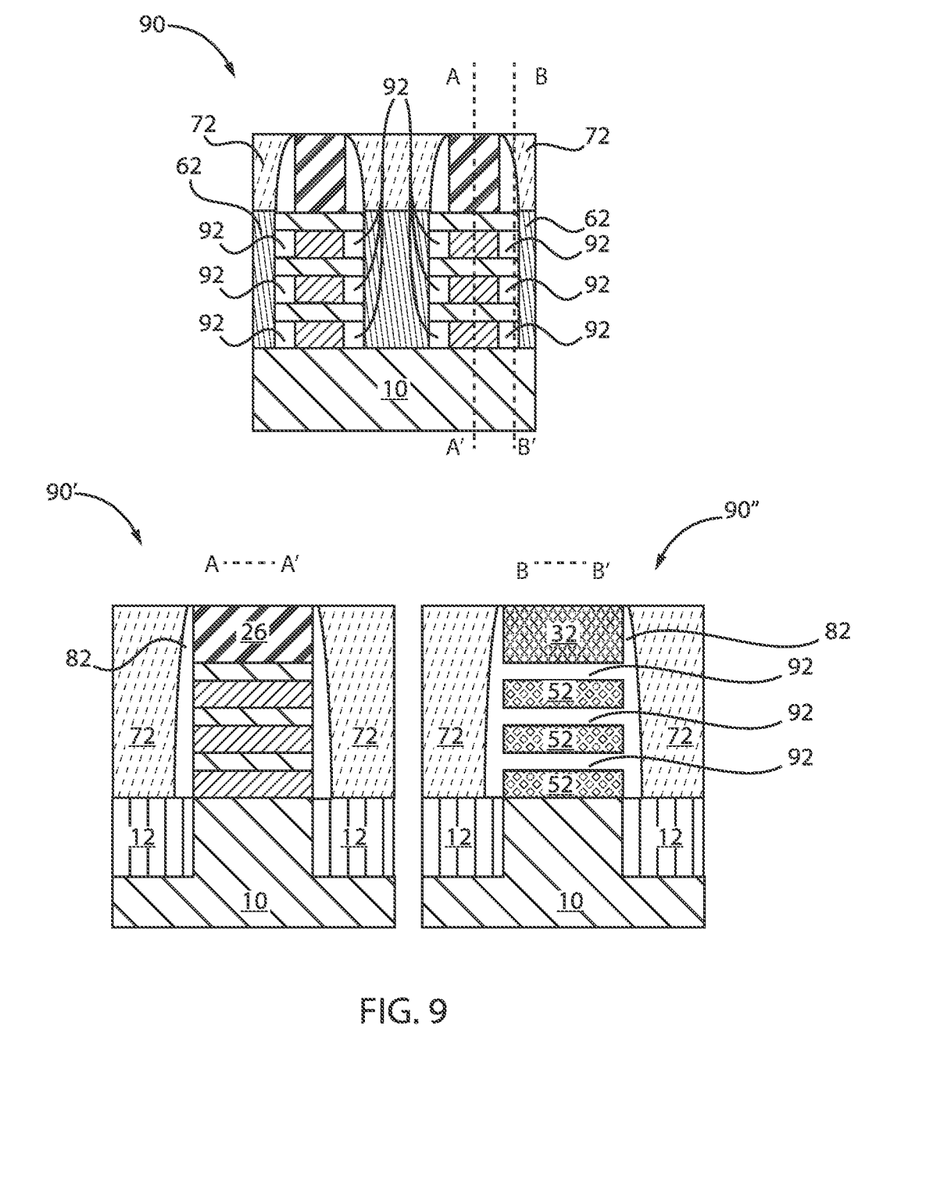
FIG. 9 is a cross-sectional view of the semiconductor structure of FIG. 8 where the inner spacers are removed, in accordance with an embodiment of the present invention.

FIG. 9 is a cross-sectional view of the semiconductor structure of FIG. 8 where the inner spacers are removed, in accordance with an embodiment of the present invention.

In various example embodiments, in structures 90, 90', 90", the inner spacers 52 are removed, thus creating openings 92 between the recessed SiGe layers 22 and the source/drain regions 62. The openings 92 are further visible in structure 90", which is a cross-sectional view taken along line B-B'. The removal can be accomplished by etching, such as, e.g., RIE.

Figure 10:
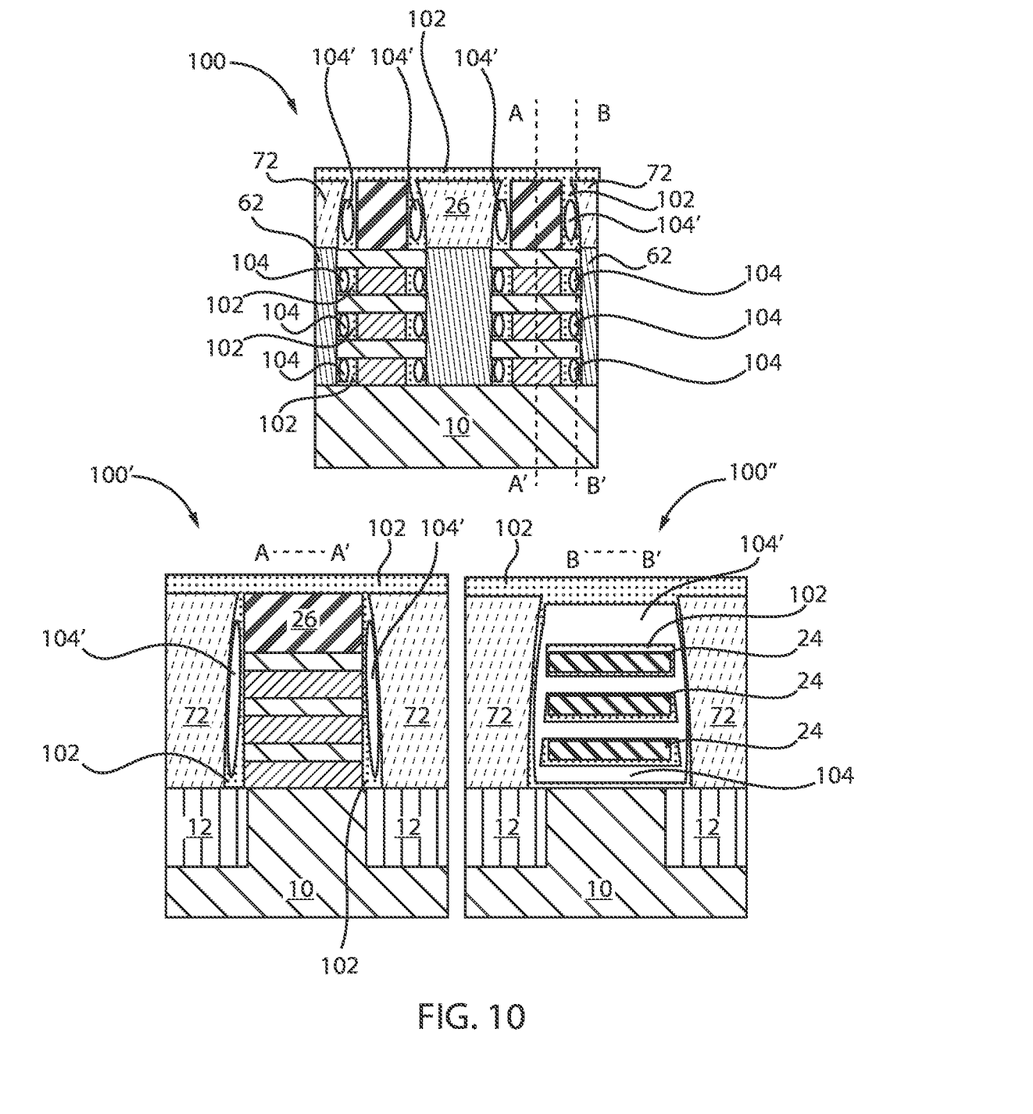
FIG. 10 is a cross-sectional view of the semiconductor structure of FIG. 9 where a spacer is deposited and airgaps are formed, in accordance with an embodiment of the present invention.

FIG. 10 is a cross-sectional view of the semiconductor structure of FIG. 9 where a spacer is deposited and airgaps are formed, in accordance with an embodiment of the present invention.

In various example embodiments, in structures 100, 100', 100", a spacer 102 is deposited by, e.g. ALD, and airgaps 104, 104' are formed or defined. The airgaps 104' are formed in the openings 82 (defined by the removal of the spacers 32) and the airgaps 104 are formed in the openings 92 (defined by the removal of inner spacers 52). Thus, two types of airgaps are formed. Airgaps 104' adjacent the dummy gate 26 and airgaps 104 adjacent the recessed SiGe layers 24. Airgaps 104' can be referred to as gate airgaps, whereas airgaps 104 can be referred to as inner spacer airgaps. The airgaps 104, 104' have a substantially circular or substantially oval configuration. The airgaps 104, 104' are completely enclosed within spacer material 102. The airgaps 104, 104' are thus formed by removing sacrificial materials or layers, and then filling them back in. Also, the airgaps 104, 104' are formed after formation of the source/drain regions 62.

The airgaps 104 are defined between the recessed SiGe layers 22 of the nanosheet stack and the source/drain regions 62. In other words, the airgaps 104 are defined between the source/drain regions 62 and the channel. The airgaps 104 are substantially aligned in a vertical manner. Stated differently, the airgaps 104 are aligned perpendicular to the substrate 10. The airgaps 104 are horizontally offset from the Si layers 24 of the nanosheet stack. The airgaps 104, 104' are substantially vertically aligned with respect to each other.

Moreover, the airgaps 104 are formed within the nanosheet stack, whereas airgaps 104' are formed over the nanosheet stack. Thus, the airgaps 104 are formed in a different region than the airgaps 104'. The airgaps 104' also occupy a space that is greater than the space occupied by the airgaps 104. In other words, the airgaps 104' are bigger than the airgaps 104. Also, the airgaps 104, 104' are formed before the gate formation.

It is also noted that the airgaps 104, 104' reduce parasitic capacitance. Embodiments in accordance with the present invention provide methods and devices for reducing parasitic capacitance between, e.g., gate structures and source/drain regions. In electrical circuits, parasitic capacitance is unwanted capacitance that exists between parts of an electronic component or circuit simply because of their proximity to each other. When two electrical conductors at different voltages are close together, the electric field between them causes electric charge to be stored thereon, which is referred to as parasitic capacitance. Therefore, reducing front end of line (FEOL) parasitic capacitance remains a focus for advanced technology node development. The exemplary embodiments provide for air-gaps that can be created and incorporated into semiconductor manufacturing technology to reduce parasitic capacitance.

Figure 11:
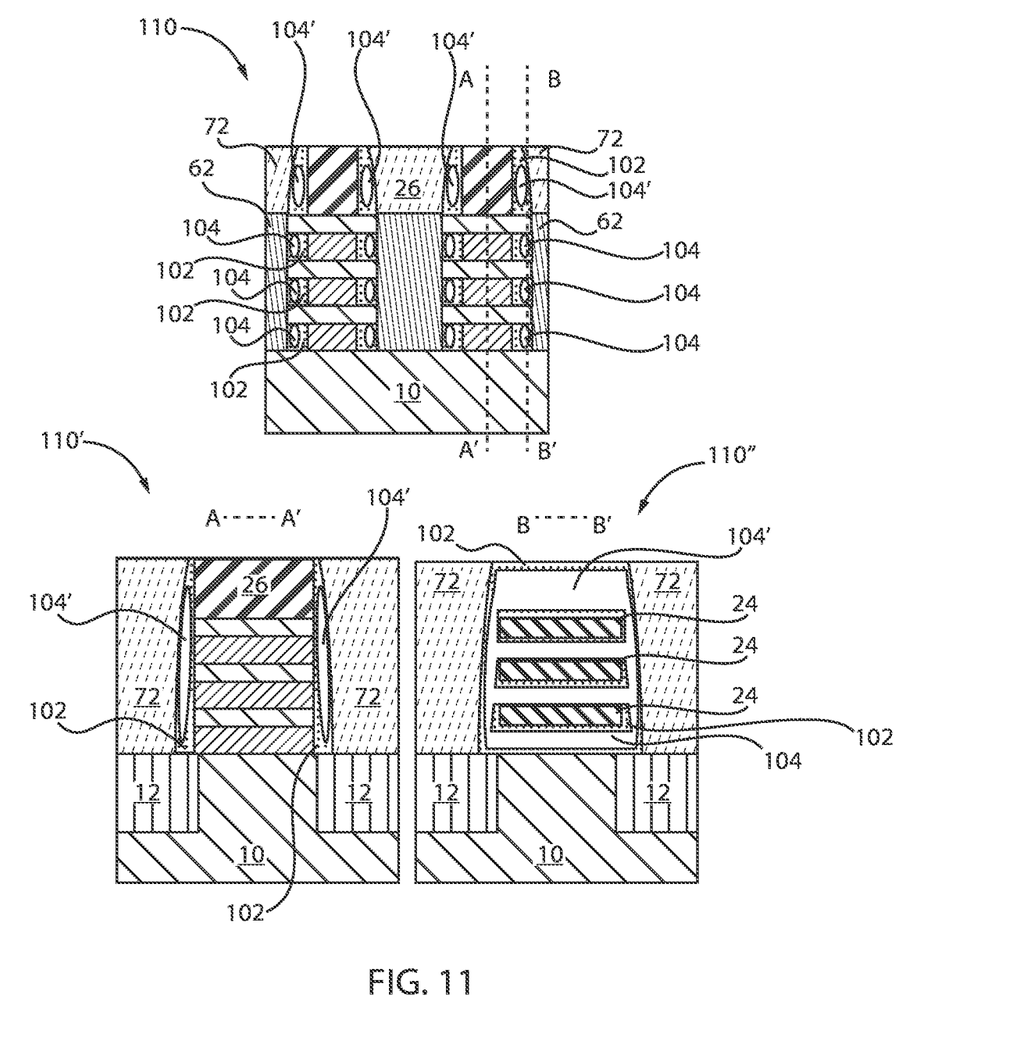
FIG. 11 is a cross-sectional view of the semiconductor structure of FIG. 10 where a CMP polish takes place, in accordance with an embodiment of the present invention.

FIG. 11 is a cross-sectional view of the semiconductor structure of FIG. 10 where a CMP polish takes place, in accordance with an embodiment of the present invention.

In various example embodiments, in structures 110, 110', 110'', a CMP polish takes place to recess the spacer 102 to expose a top surface of the dummy gate 26, as well as a top surface of the ILD 72.

Figure 12:
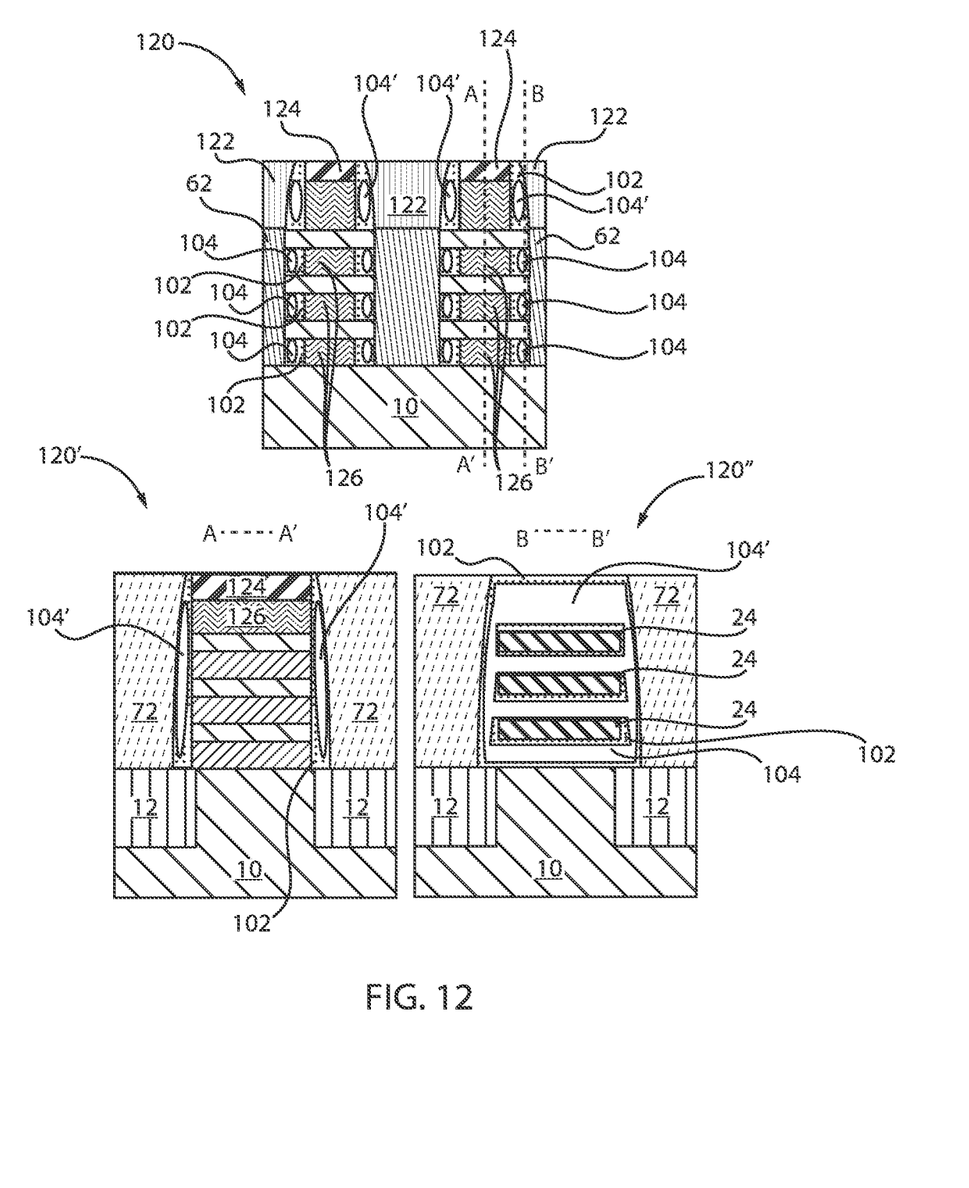
FIG. 12 is a cross-sectional view of the semiconductor structure of FIG. 11 where a high-k metal gate (HKMG), a conductive material, and a self-aligned contact (SAC) cap are formed, in accordance with an embodiment of the present invention.

FIG. 12 is a cross-sectional view of the semiconductor structure of FIG. 11 where a high-k metal gate, a conductive material, and a self-aligned contact (SAC) cap are formed, in accordance with an embodiment of the present invention.

In various example embodiments, in structures 120, 120', 120'', a high-k metal gate (HKMG) 126, a conductive material 122, and a self-aligned contact (SAC) 124 are deposited.

In various embodiments, the HKMG 126 can include but is not limited to work function metals such as titanium nitride, titanium carbide, titanium aluminum carbide, tantalum nitride and tantalum carbide; conducting metals such as tungsten, aluminum and copper; and oxides such as silicon dioxide ($SiO_2$), hafnium oxide (e.g., $HfO_2$), hafnium silicon oxide (e.g., $HfSiO_4$), hafnium silicon oxynitride ($Hf_wSi_xO_yN_z$), lanthanum oxide (e.g., $La_2O_3$), lanthanum aluminum oxide (e.g., $LaAlO_3$), zirconium oxide (e.g., $ZrO_2$), zirconium silicon oxide (e.g., $ZrSiO_4$), zirconium silicon oxynitride ($Zr_wSi_xO_yN_z$), tantalum oxide (e.g., $TaO_2$, $Ta_2O_5$), titanium oxide (e.g., $TiO_2$), barium strontium titanium oxide (e.g., $BaTiO_3$—$SrTiO_3$), barium titanium oxide (e.g., $BaTiO_3$), strontium titanium oxide (e.g., $SrTiO_3$), yttrium oxide (e.g., $Y_2O_3$), aluminum oxide (e.g., $Al_2O_3$), lead scandium tantalum oxide ($Pb(Sc_xTa_{1-x})O_3$), and lead zinc niobate (e.g., $PbZn_{1/3}Nb_{2/3}O_3$).

The conductive material 122, can be, e.g., tungsten (W) deposited over and in direct contact with the source/drain regions 62. A self-aligned contact (SAC) cap 64 is then formed over the HKMG 126.

Regarding FIGS. 1-12, deposition is any process that grows, coats, or otherwise transfers a material onto the wafer. Available technologies include, but are not limited to, thermal oxidation, physical vapor deposition (PVD), chemical vapor deposition (CVD), electrochemical deposition (ECD), molecular beam epitaxy (MBE) and more recently, atomic layer deposition (ALD) among others. As used herein, "depositing" can include any now known or later developed techniques appropriate for the material to be deposited including but not limited to, for example: chemical vapor deposition (CVD), low-pressure CVD (LPCVD), plasma-enhanced CVD (PECVD), semi-atmosphere CVD (SACVD) and high density plasma CVD (HDPCVD), rapid thermal CVD (RTCVD), ultra-high vacuum CVD (UHVCVD), limited reaction processing CVD (LRPCVD), metal-organic CVD (MOCVD), sputtering deposition, ion beam deposition, electron beam deposition, laser assisted deposition, thermal oxidation, thermal nitridation, spin-on methods, physical vapor deposition (PVD), atomic layer deposition (ALD), chemical oxidation, molecular beam epitaxy (MBE), plating, evaporation.

The term "processing" as used herein includes deposition of material or photoresist, patterning, exposure, development, etching, cleaning, stripping, implanting, doping, stressing, layering, and/or removal of the material or photoresist as needed in forming a described structure.

It is to be understood that the present invention will be described in terms of a given illustrative architecture; however, other architectures, structures, substrate materials and process features and steps/blocks can be varied within the scope of the present invention.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical mechanisms (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which usually include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present embodiments. The compounds with additional elements will be referred to herein as alloys.

Reference in the specification to "one embodiment" or "an embodiment" of the present invention, as well as other variations thereof, means that a particular feature, structure, characteristic, and so forth described in connection with the embodiment is included in at least one embodiment of the present invention. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, can be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device can be otherwise oriented (rotated 90 degrees or at other orientations), and the spatially relative descriptors used herein can be interpreted accordingly. In addition, it will also be understood that when a layer is referred to as being "between" two layers, it can be the only layer between the two layers, or one or more intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

Having described preferred embodiments of a method for forming nanosheet transistors with inner airgaps (which are intended to be illustrative and not limiting), it is noted that modifications and variations can be made by persons skilled in the art in light of the above teachings. It is therefore to be understood that changes may be made in the particular embodiments described which are within the scope of the invention as outlined by the appended claims. Having thus described aspects of the invention, with the details and particularity required by the patent laws, what is claimed and desired protected by Letters Patent is set forth in the appended claims.

The invention claimed is:

1. A nanosheet transistor comprising:
    a nanosheet stack including alternating layers of a recessed first material and a second material;
    source/drain regions disposed adjacent the nanosheet stack;
    a conductive material disposed over the source/drain regions;
    first airgaps defined between the source/drain regions and the recessed alternating layers of the first material, the first airgaps enclosed by a single spacer; and
    second airgaps defined adjacent the conductive material, wherein the first airgaps are vertically aligned with the second airgaps.

2. The nanosheet transistor of claim 1, wherein the second airgaps are larger than the first airgaps.

3. The nanosheet transistor of claim 1, wherein the first airgaps are oval-shaped.

4. The nanosheet transistor of claim 1, wherein the second airgaps are oval-shaped.

5. The nanosheet transistor of claim 1, wherein the first airgaps are horizontally aligned with the alternating layers of the recessed first material.

6. The nanosheet transistor of claim 1, wherein the first and second airgaps are perpendicular to a substrate.

7. The nanosheet transistor of claim 1, wherein the first airgaps are formed within the nanosheet stack.

8. The nanosheet transistor of claim 1, wherein the second airgaps are formed over the nanosheet stack.

9. The nanosheet transistor of claim 1, wherein the second airgaps occupy a space greater that a space occupied by the first airgaps.

10. The nanosheet transistor of claim 1, wherein the source/drain regions directly contact an entire length of the nanosheet stack.

11. A nanosheet transistor comprising:
a nanosheet stack including alternating layers of a recessed first material and a second material;
first airgaps defined between the recessed alternating layers of the first material, the first airgaps enclosed by a single spacer; and
second airgaps defined adjacent a conductive material,
wherein the first airgaps are vertically aligned with the second airgaps.

12. The nanosheet transistor of claim 11, wherein source/drain regions are disposed adjacent the nanosheet stack.

13. The nanosheet transistor of claim 12, wherein the conductive material is disposed over the source/drain regions.

14. The nanosheet transistor of claim 11, wherein the second airgaps are larger than the first airgaps.

15. The nanosheet transistor of claim 11, wherein the first airgaps are oval-shaped and the second airgaps are oval-shaped.

16. The nanosheet transistor of claim 11, wherein the first airgaps are horizontally aligned with the alternating layers of the recessed first material.

17. The nanosheet transistor of claim 11, wherein the first and second airgaps are perpendicular to a substrate.

18. The nanosheet transistor of claim 11, wherein the first airgaps are formed within the nanosheet stack.

19. The nanosheet transistor of claim 11, wherein the second airgaps are formed over the nanosheet stack.

20. The nanosheet transistor of claim 11, wherein the second airgaps occupy a space greater that a space occupied by the first airgaps.

* * * * *